(12) United States Patent
Hosokawa (10) Patent No.: US 6,548,816 B2
(45) Date of Patent: Apr. 15, 2003

(54) STIGMATOR ASSEMBLY

(75) Inventor: Fumio Hosokawa, Tokyo (JP)

(73) Assignee: Jeol Ltd., Tokyo (JP)

( * ) Notice: Subject to any disclaimer, the term of this patent is extended or adjusted under 35 U.S.C. 154(b) by 0 days.

(21) Appl. No.: 09/917,806

(22) Filed: Jul. 24, 2001

(65) Prior Publication Data

US 2002/0121609 A1 Sep. 5, 2002

(30) Foreign Application Priority Data

Jul. 25, 2000 (JP) ........................................ 2000-223628

(51) Int. Cl.⁷ .................................................. G01I 5/02

(52) U.S. Cl. ................................. 250/396 ML; 250/396

(58) Field of Search ................................. 250/396 ML (56) References Cited

U.S. PATENT DOCUMENTS 4,162,403 A * 7/1979 Baumgarten ......... 250/396 ML
4,214,162 A * 7/1980 Hoppe et al. ............... 250/311

OTHER PUBLICATIONS

"Three–fold astigmatism in high–resolution transmission electron microscopy", O.L. Krivanek, *Ultramicroscopy*, 55 (1994), pp. 419–433.

* cited by examiner

*Primary Examiner*—John Barlow
*Assistant Examiner*—Alfred Dudding
(74) *Attorney, Agent, or Firm*—Webb Ziesenheim Logsdon Orkin & Hanson, P.C.

(57) ABSTRACT

A stigmator assembly capable of correcting even three-fold astigmatism without increasing the size of an electron microscope or the like in which the assembly is mounted. Values indicating control parameters $A_3$ and $\theta_h$ are set with control knobs and entered into a first arithmetic circuit. Values indicating control parameters $A_2$ and $\theta_q$ are set with control knobs and input into a second arithmetic circuit. The first arithmetic circuit calculates current values for producing a corrective hexapole field, using the entered control parameters $A_3$ and $\theta_h$. The second arithmetic circuit calculates current values for producing a corrective quadrupole field, using the entered control parameters $A_2$ and $\theta_q$. An adder circuit supplies control currents into coils, respectively, the control currents corresponding to the sums of the values calculated by the arithmetic circuits.

5 Claims, 6 Drawing Sheets

STIGMATOR ASSEMBLY

BACKGROUND OF THE INVENTION

1. Field of the Invention

The present invention relates to a stigmator assembly for correcting astigmatism produced in an instrument using a charged-particle beam such as a transmission electron microscope and, more particularly, to a stigmator assembly capable of correcting even three-fold astigmatism.

2. Description of the Related Art

With respect to on-axis astigmatism due to parasitic aberration in a transmission electron microscope, the first-order on-axis astigmatism shows a two-fold symmetry from a viewpoint of geometrical optics, while the second-order on-axis astigmatism shows a three-fold symmetry. Generally, an electron microscope is equipped with an octopole coil assembly for introducing a quadrupole field in the plane of the opening to correct astigmatism with a two-fold symmetry (hereinafter referred to as two-fold astigmatism). The exciting currents through the coils are controlled to produce a magnetic field for canceling the two-fold astigmatism.

Since the effect of astigmatism with a three-fold symmetry (hereinafter referred to as three-fold astigmatism) on the image is smaller than second-fold astigmatism, the necessity of correction of three-fold astigmatism has not been great. However, installation of a field emission gun or the like has increased the response characteristics of the electron microscope relative to the spatial frequency. Where such improved response characteristics are taken into consideration, image distortion due to three-fold astigmatism can no longer be neglected.

Generation of three-fold astigmatism and its correction are hereinafter described briefly. In an electromagnetic lens, the magnetic potential has slight deviation from axial symmetry. The deviation is caused by the fact that the bore in the polepieces forming the potential is not perfectly circular. In a cylindrical coordinate system (r, θ, z), expanding an arbitrary potential φ into Fourier components ($A_m$ (r, z), $B_m$ (r, z)) with respect to θ gives rise to $$\phi = \frac{\sum (A_m(r,z)\cos(m\theta) + B_m(r,z)\sin(m\theta))}{m} \quad (1)$$

Expansion into Fourier components in the cylindrical coordinate system (r, θ, z) is known as multiple magnetic field expansion.

Generally, terms other than axially symmetrical components appear in φ (r, θ, z) and induce different kinds of parasitic aberrations. The effects of disordered deviation from axial symmetry can be expressed as a combination of aberrations corresponding to multiple poles that are expanded terms. For the sake of simplicity of illustration, it is assumed that uniformity is achieved in the z-direction. Of the expanded components, the aberration induced by a potential given by Eq. (2) is considered.

$$\phi_3 = C_3 r^3 \cos 3(\theta_3 - \theta) \quad (2)$$

Figure 5:
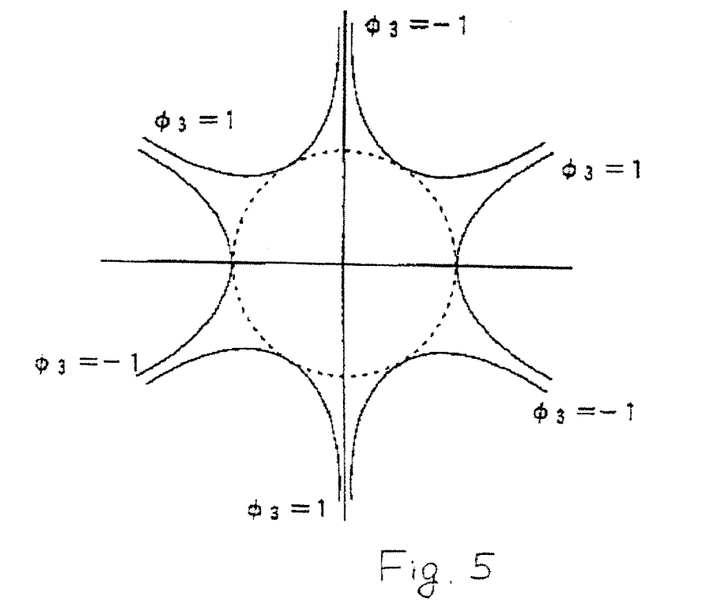
FIG. 5 is a diagram illustrating an example of potential distribution that induces three-fold astigmatism.

In Eq. (2), $C_3$ indicates the amount of potential, and $\theta_3$ indicates the phase of the potential. Examples of distribution of $\phi_3$ are shown in FIG. 5, where distributions of $\phi_3=1$ and $\phi_3=-1$ are shown under the condition where $C_3=1$ and $\theta_3=0$. In FIG. 5, the circle inscribing the curves has r=1. Let B be a magnetic field derived from the potential given by Eq. (2). As shown in the potential curves of FIG. 5, the magnetic field B in this case is a hexapole field owing to a hexapole. Using (r, θ) coordinates, the magnetic field B is given by $$B = -u_0 \nabla \phi_3 \quad (3)$$

$$= -u_0\left(\frac{\partial}{\partial r}, \frac{1}{r}\frac{\partial}{\partial \theta}\right)\phi_3$$

$$= -u_0 C_3(3r^2\cos 3(\theta_3 - \theta), -3r^2\sin 3(\theta_3 - \theta))$$

Figure 6:
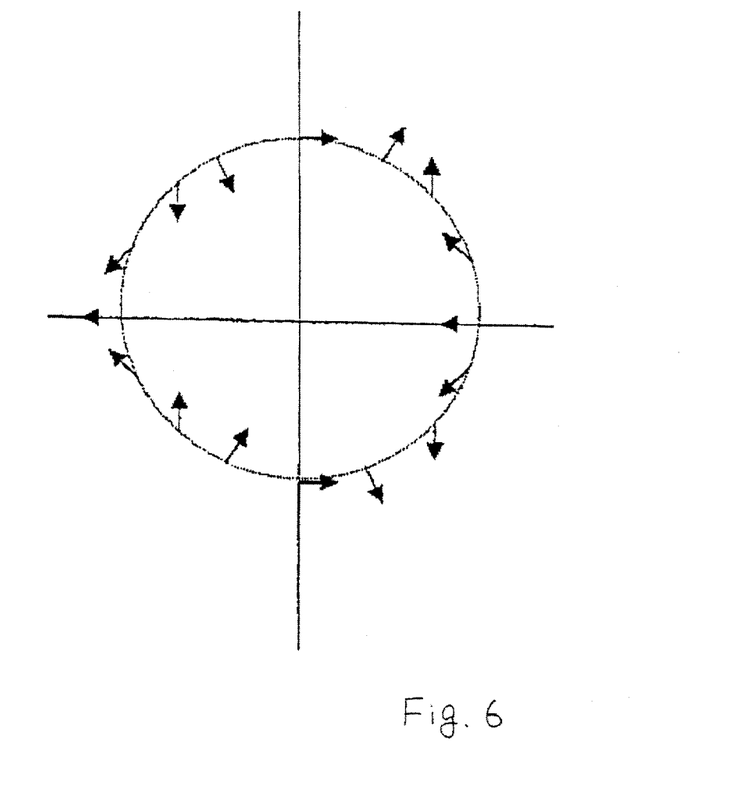
FIG. 6 is a diagram showing the state of a magnetic field distribution on a circle that inscribes potential curves.

The state of the magnetic field B on the circle inscribing the potential curves with $\theta_3=0$ is indicated by the arrows in FIG. 6. The magnitude of the magnetic field B is constant on the circumference and is a quadratic function of r that does not depend on θ, as given by Eq. (4).

$$|B|=3C_3 u_0 r^2 \quad (4)$$

If a round electron beam enters the magnetic field having the distribution as shown in FIG. 6 perpendicularly to the plane of the paper, the shape of the electron beam is distorted into a three-fold symmetry, i.e., rotational symmetry of 120°. This is three-fold astigmatism.

Figure 7:
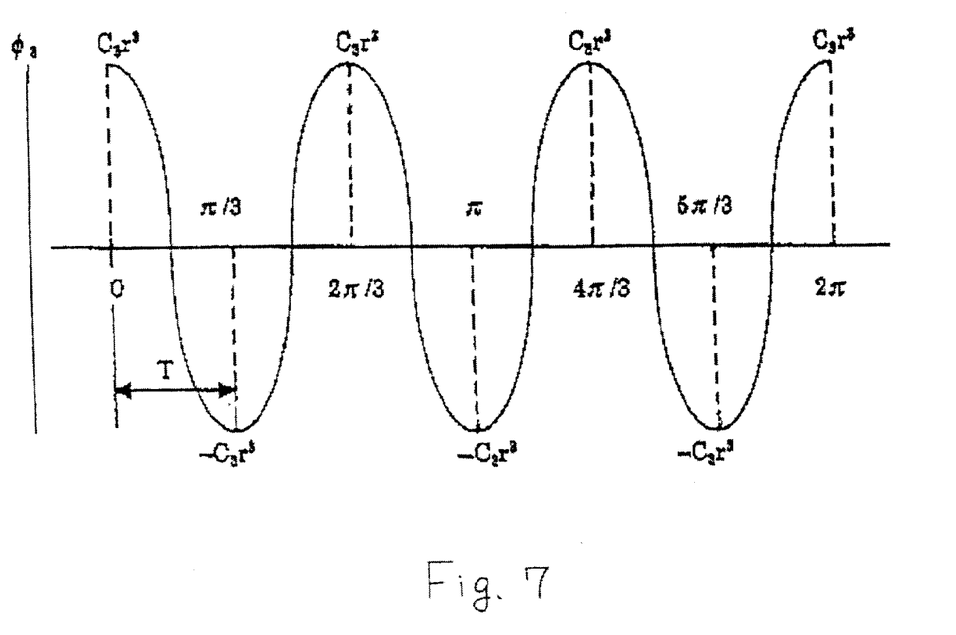
FIG. 7 is a diagram illustrating examples of potentials to be canceled by coils.

Of the deviation from the axially symmetrical components of the electromagnetic lens, the potential distribution as shown in FIG. 5 induces three-fold astigmatism. Therefore, in order to correct three-fold astigmatism, a potential distribution that cancels the astigmatism should be given close to the plane of opening of the electromagnetic lens. The r in Eq. (3) is made constant, and variation of $\theta_3$ with varying θ is shown in FIG. 7. This variation corresponds to variation in the potential on the circle inscribing the potential curves shown in FIGS. 5 and 6.

It is assumed that m coils $L_n$ (n=1, 2, . . . , m) are placed on the circumference of the opening plane of the electromagnetic lens such that the coils are angularly regularly spaced from each other at intervals of T from θ=0 to correct three-fold astigmatism. Let $L_n$Ih be the ampere-turn of each coil necessary for the correction. The ampere-turn $L_n$Ih is the coil exciting currents corresponding to the potentials assigned to the coils, respectively, to form the corrective field. In FIG. 7, the potentials to be canceled by coils arranged under the conditions where $\theta_3=0$, m=6, and T=π/3 are indicated by the broken lines. Generally, the ampere-turn $L_n$Ih is given by $$L_n Ih = C_3 r^3 \cos 3(\theta_3 - nT)(T=2\pi/m) \quad (5)$$

Ideally, infinitesimal coils are placed consecutively (T→0) to reproduce the distribution based on Eq. (3) and shown in FIG. 7. In reality, however, only one achievable method is to place a finite number of coils having finite dimensions. Even in this case, the exciting currents can be estimated using Eq. (5). Under the present situations, the coils are placed, taking account of points corresponding to the maximum value ($C_3 r^3$) and the minimum value ($-C_3 r^3$) in the distribution shown in FIG. 7. Six coils are necessary to create a hexapole field for correcting three-fold astigmatism. To rotate the magnetic field freely, 12 coils are generally placed.

As mentioned previously, three-fold astigmatism can be corrected by a stigmator in which 12 coils are positioned. However, in an electron microscope or the like, an octopole coil assembly has been already installed as some two-fold stigmators for correcting two-fold astigmatism. To correct three-fold astigmatism in an electron microscope, it is desired to place such stigmators in both illumination lens system and condenser lens system. If such stigmators are added under the condition where plural two-fold stigmators are installed, the height of the microscope column of the electron microscope is increased. Generally, limitations are placed on the height of a location where an electron microscope is installed. Where such limitations are taken into consideration, a three-fold stigmator may not be incorporated.

SUMMARY OF THE INVENTION

It is an object of the present invention to provide a stigmator assembly which comprises two-fold stigmators and a three-fold stigmator all mounted in an electron microscope, and capable of correcting even three-fold astigmatism, and having the same height as the conventional stigmator assembly having only two-fold stigmators.

A stigmator assembly in accordance with the present invention is equipped with plural stigmator coils circumferentially regularly spaced from each other on a circumference. The stigmator assembly further includes a control circuit for supplying sum control currents into the coils. The sum control currents are obtained by adding first control currents for producing a magnetic field that corrects three-fold astigmatism to second control currents for producing a magnetic field that corrects two-fold astigmatism.

Other objects and features of the invention will appear in the course of the description thereof, which follows.

DESCRIPTION OF THE PREFERRED EMBODIMENTS

Figure 1:
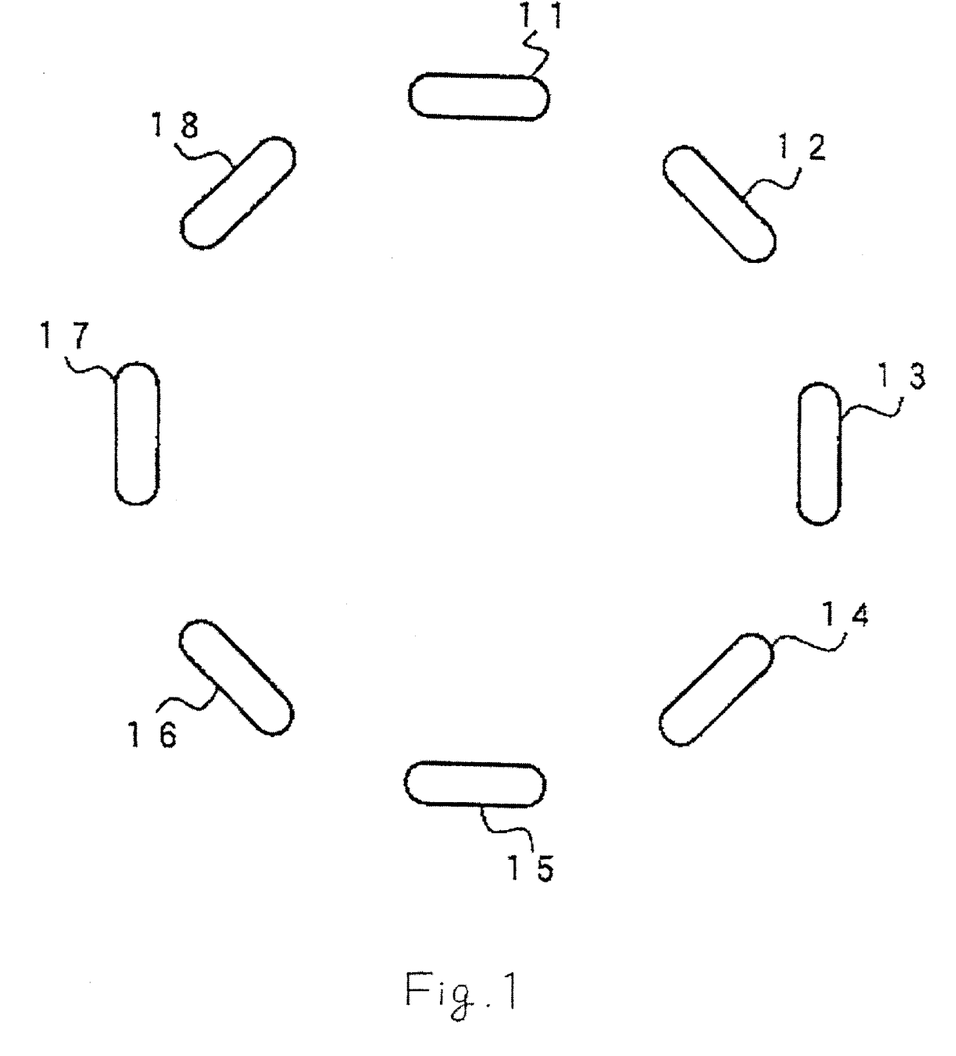
FIG. 1 is a schematic diagram of an octopole coil assembly.

In a first embodiment of the present invention, there is provided a stigmator assembly capable of correcting even three-fold astigmatism using an octopole coil assembly that would normally be used to correct only two-fold astigmatism, the octopole coil assembly being conventionally installed in a transmission electron microscope or the like. The octopole coil assembly using stigmator coils 11–18 is schematically shown in FIG. 1.

Since the coils 11–18 are circumferentially regularly spaced from each other on a circumference, exciting currents fed into the coils 11–18 for correcting three-fold astigmatism can be determined by setting T=π/4 based on m=8 in Eq. (5). For simplicity, it is assumed that $C_3 r^3 = A_3$ and $\theta_3 = -\theta_h$. Thus, we have $$L_n Ih = A_3 \cos 3(\theta_h + n\pi/4) \tag{6}$$

Accordingly, arbitrary three-fold astigmatism can be corrected by supplying exciting currents $L_n Ih$ (n=1 to 8) into the coils 11–18, respectively, the exciting currents being determined by Eq. (6). That is, arbitrary three-fold astigmatism can be corrected by supplying the currents $L_n Ih$ (n=1 to 8) into the coils 11–18, respectively, for producing a hexapole field in which coefficient $A_3$ for determining the strength of the hexapole field and coefficient $\theta_h$ for determining the phase angle of the hexapole field have been adjusted. Control parameters for the correction are $A_3$ and $\theta_h$, which correspond to the amplitude and phase, respectively, of three-fold astigmatism.

Similar consideration is given to two-fold astigmatism. In the case of a quadrupole, the potential distribution is selected as given by Eq. (7), and the exciting currents fed into the m coils for correcting two-fold astigmatism can be determined.

$$\phi_2 = C_2 r^2 \cos 2(\theta_2 - \theta) \tag{7}$$

where $C_2$ indicates the amount of potential and $\theta_2$ indicates the phase of potential. Let $L_n Iq$ be the ampere-turn of each coil necessary for correction of two-fold astigmatism where m coils $L_n$ (n=1, 2, . . . , m) are angularly regularly spaced from each other at intervals of T from θ=0 on the circumference of the opening plane of the electromagnetic lens to correct two-fold astigmatism. The ampere-turn is given by $$L_n Iq = C_2 r^2 \cos 2(\theta_2 - nT) \quad (T=2\pi/m) \tag{8}$$

In this embodiment, there are eight coils 11–18 and so the exciting currents through the coils 11–18 for correcting two-fold astigmatism can be determined by setting T=π/4 based on m=8 in Eq. (8). Assuming $C_2 r^2 = A_2$ and $\theta_2 = -\theta_q$, we have $$L_n Iq = A_2 \cos 2(\theta_q + n\pi/4) \tag{9}$$

Arbitrary two-fold astigmatism can be corrected by supplying the exciting currents $L_n Iq$ (n=1 to 8) determined by Eq. (9). That is, arbitrary two-fold astigmatism can be corrected by supplying currents $L_n Iq$ (n=1 to 8) for producing a hexapole field, in which coefficient $A_2$ for determining the strength of the hexapole field and coefficient $\theta_q$ for determining the phase angle of the hexapole field have been adjusted, according to the produced two-fold astigmatism. Control parameters for the correction are $A_2$ and $\theta_q$, which correspond to the amplitude and phase, respectively, of the two-fold astigmatism.

Where the sum currents that are the sums of the exciting currents given by Eq. (6) and the exciting currents given by Eq. (9) are supplied into the coils 11–18, a magnetic field produced based on the linearity of magnetic field is the sum of a magnetic field created by the exciting currents given by Eq. (6) and a magnetic field created by exciting currents given by Eq. (9). Also, the force that charged particles such as an electron beam undergoes from the magnetic field has a linear relation to the magnetic field. That is, the effect of the magnetic field created by the sum currents on the charged particles is the sum of the effect of the magnetic field produced by the exciting currents given by Eq. (6) and the effect of the magnetic field produced by the exciting currents given by Eq. (9). This assures effectiveness of the decomposition of aberration based on Eq. (1).

Therefore, three-fold astigmatism and two-fold astigmatism can be corrected without interference using a single octopole coil assembly by controlling the sum currents flowing through the coils 11–18 with the control parameters $A_3$, $\theta_h$, $A_2$, and $\theta_q$.

Figure 2:
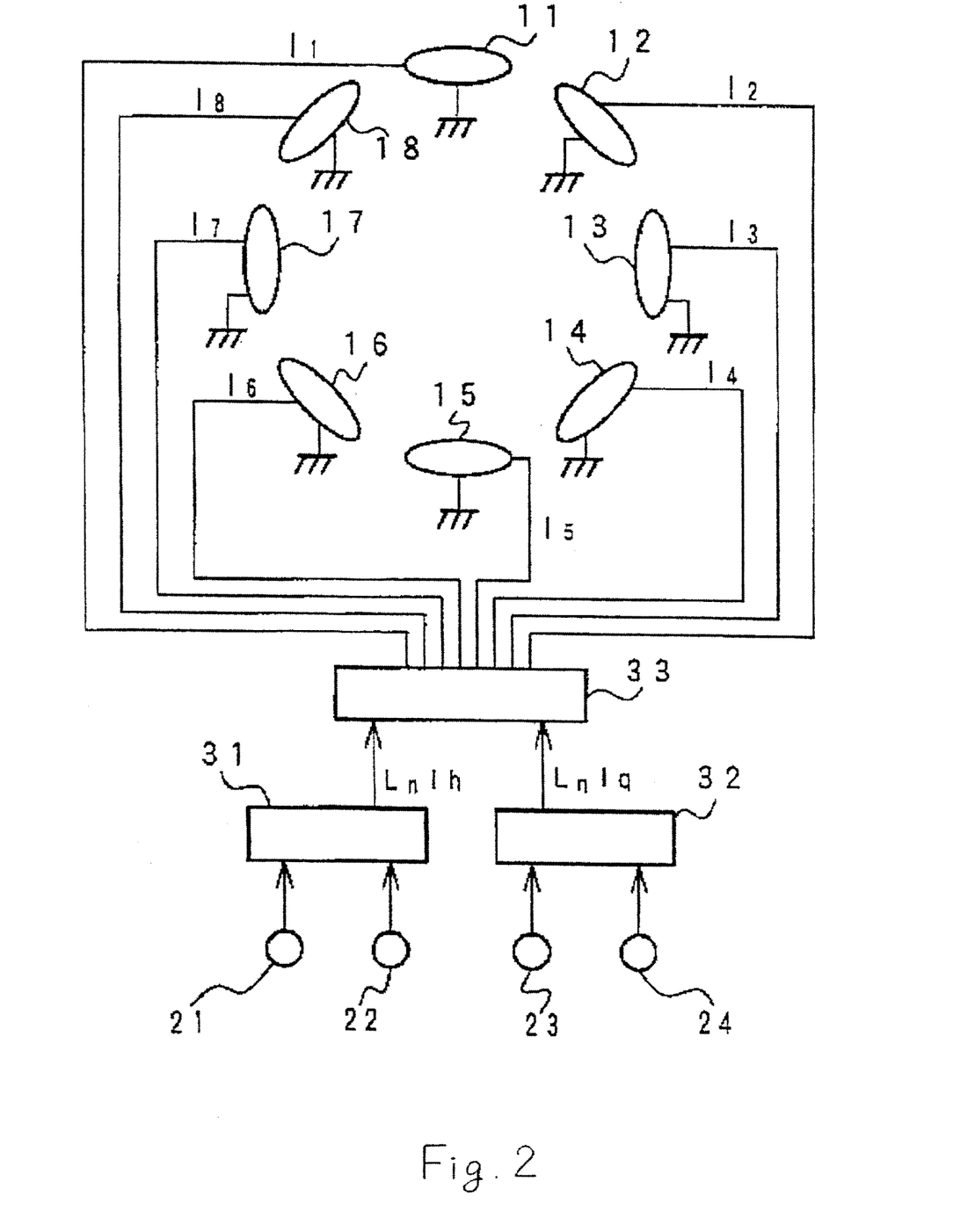
FIG. 2 is a block diagram of a stigmator assembly using the octopole coil assembly.

FIG. 2 is a block diagram of a stigmator assembly using an octopole coil assembly. In this example, four kinds of control knobs 21, 22, 23, and 24 are prepared. These control knobs 21–24 are input and setting means permitting a human operator to set the control parameters $A_3$, $\theta_h$, $A_2$, and $\theta_q$, respectively. Values indicating the control parameters $A_3$ and $\theta_h$ are set with the control knobs 21 and 22 and entered into an arithmetic circuit (first arithmetic circuit) 31. Values indicating the control parameters $A_2$ and $\theta_q$ are set with the control knobs 23 and 24 and input into another arithmetic circuit (second arithmetic circuit) 32.

The arithmetic circuit 31 performs calculations using the entered control parameters $A_3$ and $\theta_h$ in accordance with Eq. (6), and produces control currents to be supplied to the coils 11–18, respectively, according to the results of the calculations. The arithmetic circuit 32 performs calculations using the entered control parameters $A_2$ and $\theta_q$ in accordance with Eq. (9), and produces control currents to be supplied to the coils 11–18, respectively, according to the results of calculations.

An adder circuit 33 adds the control currents to be supplied to the coils 11–18 from the arithmetic circuit 31 to their respective control currents to be supplied to the coils 11–18 from the arithmetic circuit 32 for each of the coils 11–18. The adder circuit supplies the results of the additions $I_n$ (=$L_n$Ih+$L_n$Iq, where n=1 to 8) to the coils 11–18 as control currents.

The arithmetic circuits 31, 32 and the adder circuit 33 constitute a control circuit or control circuitry. The arithmetic circuits 31 and 32 may deliver calculated values that are digital values. The adder circuit 33 may sum up the digital values and then create analog control currents.

In this embodiment, three-fold astigmatism can be corrected, as well as two-fold astigmatism, using the octopole coil assembly that is conventionally installed in an electron microscope or the like and would normally be used to correct only two-fold astigmatism. Accordingly, it is not necessary to install additional corrective coils for correction of three-fold astigmatism. Consequently, the present invention can provide an environment in which three-fold astigmatism can be corrected, as well as two-fold astigmatism, without increasing the size of the microscope.

Figure 3:
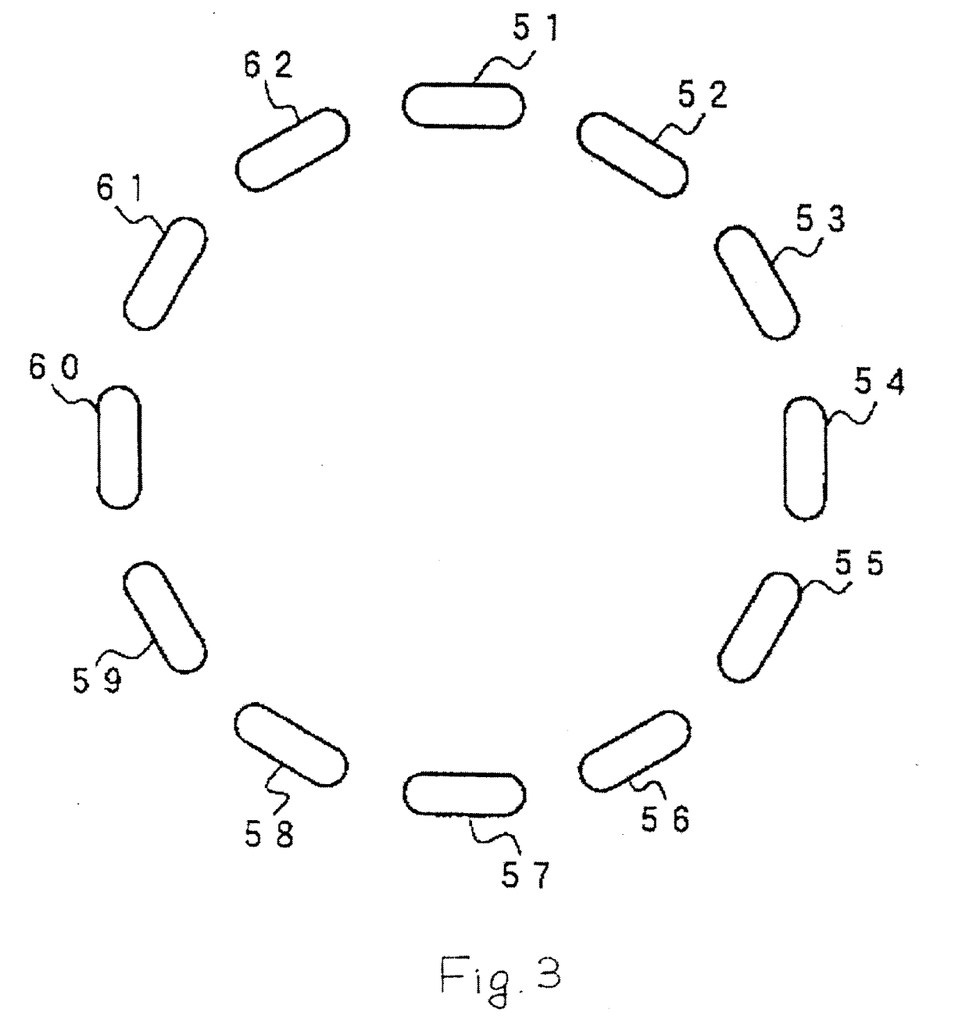
FIG. 3 is a schematic diagram of a dodecapole coil assembly.

A second embodiment of the present invention is next described. In this second embodiment, a stigmator assembly capable of correcting two- and three-fold astigmatism using a dodecapole (12 pole) coil assembly. FIG. 3 schematically shows the dodecapole coil assembly utilizing stigmator coils 51–62.

It can be seen from the above considerations that three-fold astigmatism can be corrected using the dodecapole coil assembly, by setting T=$\pi$/6 based on m=12 in Eq. (5) to thereby determine the exciting currents through the coils 51–62 for correcting three-fold astigmatism and supplying the exciting currents into their respective coils 51–62. In Eq. (5), $C_3 r^3$ is replaced by $A_3$, and $\theta_3$ is replaced by $-\theta_h$. Then, the relation T=$\pi$/6 is set. In consequence, Eq. (10) is derived.

$$L_n Ih = A_3 \cos 3(\theta_h + n\pi/6) \tag{10}$$

Arbitrary astigmatism can be corrected by supplying the exciting currents $L_n$Ih (n=1 to 12) into the coils 51–62, respectively, for producing the hexapole field determined by Eq. (10). In particular, arbitrary three-fold astigmatism can be corrected by supplying the currents $L_n$Ih (n=1 to 12) into the coils 51–62, respectively, for producing the hexapole field having current amplitude $A_3$ and phase $\theta_h$ adjusted according to the produced three-fold astigmatism.

Furthermore, $C_2 r^2$ and $\theta_2$ in Eq. (8) are replaced by $A_2$ and $-\theta_q$, respectively. The relation T=$\pi$/6 is set based on m=12. In this way, exciting currents through the coils 51–62 for correcting two-fold astigmatism as given by Eq. (11) can be determined.

$$L_n Iq = A_2 \cos 2(\theta_q + n\pi/6) \tag{11}$$

Three- and two-fold astigmatism can be corrected without interference using a single dodecapole coil assembly by supplying sum currents into the coils 51–62, respectively. The sum currents are obtained by summing up control currents controlled with the control parameters $A_3$ and $\theta_h$ based on Eq. (10) and control currents controlled with the control parameters $A_2$ and $\theta_q$ based on Eq. (11), in the same way as in the first embodiment.

Figure 4:
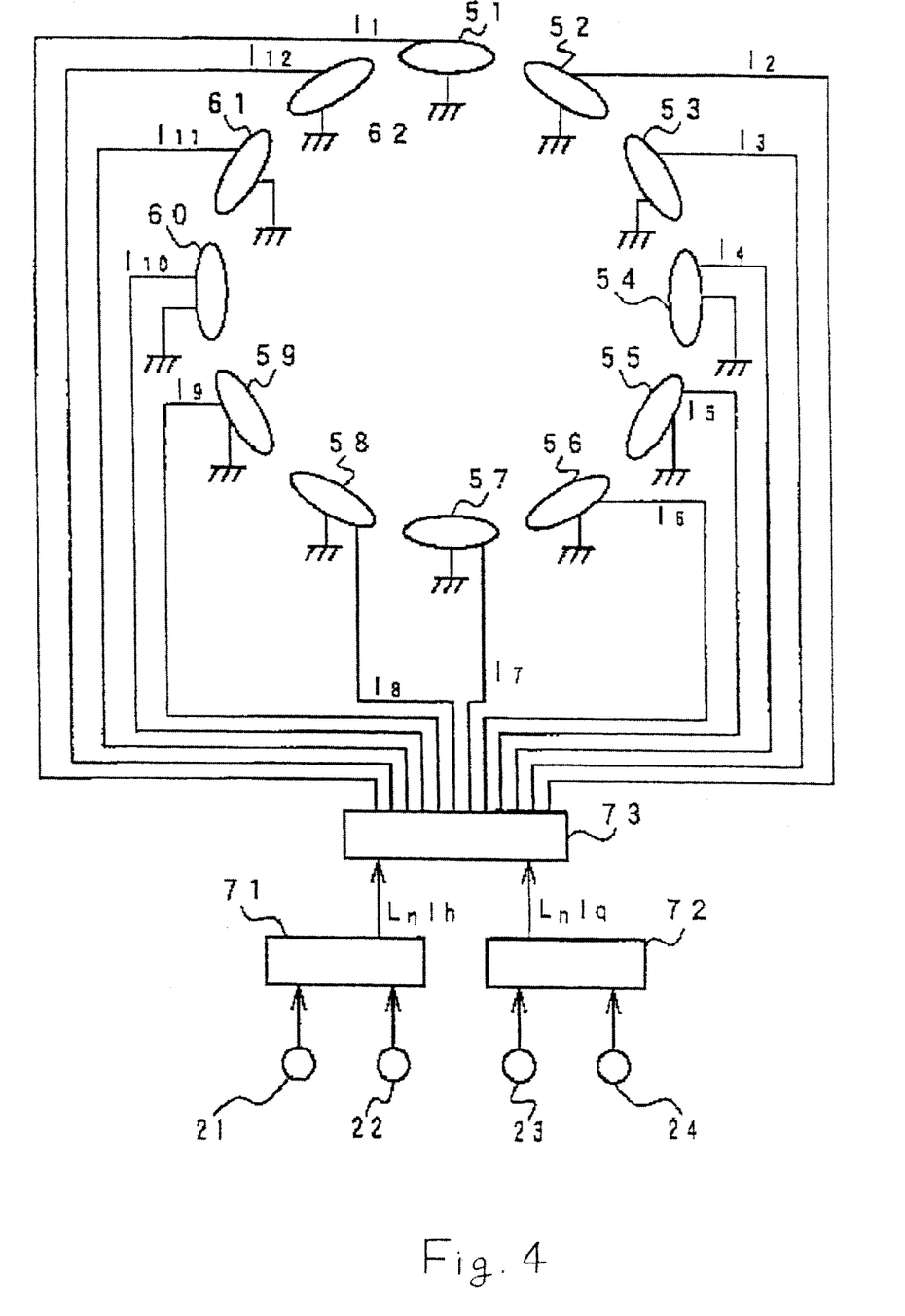
FIG. 4 is a block diagram of a stigmator assembly using the dodecapole coil assembly.

FIG. 4 is a block diagram of one example of stigmator assembly using a dodecapole coil assembly. In this configuration, values indicating the control parameters $A_3$ and $\theta_h$ are set with the control knobs 21 and 22 and entered into an arithmetic circuit (first arithmetic circuit) 71. Values indicating the control parameters $A_2$ and $\theta_q$ are set with the control knobs 23 and 24 and input into another arithmetic circuit (second arithmetic circuit) 72.

The arithmetic circuit 71 performs calculations using the entered control parameters $A_3$ and $\theta_h$ in accordance with Eq. (10), and produces control currents to be supplied to the coils 51–62, respectively, according to the results of the calculations. The arithmetic circuit 72 performs calculations using the entered control parameters $A_2$ and $\theta_q$ in accordance with Eq. (11), and produces control currents to be supplied to the coils 51–62, respectively, according to the results of calculations.

An adder circuit 73 adds the control currents to be supplied to the coils 51–62 from the arithmetic circuit 71 to their respective control currents to be supplied to the coils 51–62 from the arithmetic circuit 71 for each of the coils 51–62. The adder circuit supplies the results of the additions $I_n$ (=$L_n$Ih+$L_n$Iq, where n=1 to 12) to the coils 51–62 as control currents.

The arithmetic circuits 71, 72 and the adder circuit 73 constitute control circuitry. The arithmetic circuits 71 and 72 may deliver calculated values that are digital values. The adder circuit 73 may sum up the digital values and then create analog control currents.

In this embodiment, two- and three-fold astigmatism can be corrected by installing a dodecapole coil assembly instead of an octopole coil assembly that is conventionally installed in an electron microscope or the like and would normally be used to correct only two-fold astigmatism. Accordingly, it is not necessary to install both coils for correction of two-fold astigmatism and three-fold astigmatism, respectively. Consequently, the present invention can provide an environment in which three-fold astigmatism can be corrected, as well as two-fold astigmatism, without increasing the size of the microscope.

As described thus far, the present invention provides a stigmator assembly equipped with plural stigmator coils circumferentially regularly spaced from each other on a circumference. For example, the stigmator coils constitute an octopole coil assembly or dodecapole coil assembly. Hexapole field control currents for producing a hexapole field for correcting three-fold astigmatism are used. Also, quadrupole field control currents for producing a quadrupole field for correcting two-fold astigmatism are used. The hexapole field control currents and the quadrupole field control currents are added up and supplied into the coils. Consequently, two-fold astigmatism and three-fold astigmatism can be corrected simultaneously by the single octopole or dodecapole coil assembly. Both two-fold astigmatism and three-fold astigmatism can be corrected without increasing the size of the instrument incorporating the stigmator assembly.

Furthermore, in an electron microscope equipped with a conventional octopole coil assembly for correction of two-fold astigmatism, three-fold astigmatism can also be corrected without interference with the correction of two-fold astigmatism without adding any corrective coils. In an electron microscope equipped with a conventional octopole coil assembly for correction of two-fold astigmatism, correction of two-fold astigmatism and correction of three-fold astigmatism can be made without interference by installing and using a dodecapole coil assembly instead of the octopole coil assembly.

Having thus described my invention with the detail and particularity required by the Patent Laws, what is desired protected by Letters Patent is set forth in the following claims.

What is claimed is:

1. A stigmator assembly comprising:

plural stigmator coils circumferentially regularly spaced from each other on a circumference; and a control circuit for supplying sum control currents into said stigmator coils, said sum control currents being obtained by adding first control currents and second control currents, said first control currents being used to produce a magnetic field for correction of three-fold astigmatism, and said second control currents being used to produce a magnetic field for correction of two-fold astigmatism.

2. The stigmator assembly of claim 1, wherein said stigmator coils constitute an octopole coil assembly or a dodecapole coil assembly.

3. The stigmator assembly of claim 1, wherein said control circuit includes a first arithmetic circuit for calculating the values of the first control currents to be supplied into said coils to correct three-fold astigmatism, a second arithmetic circuit for calculating the values of the second control currents to be supplied into said coils to correct two-fold astigmatism, and an adder circuit for creating the sum control currents corresponding to the sums of the values calculated by said first arithmetic circuit and the values calculated by said second arithmetic circuit.

4. The stigmator assembly of claim 3, wherein said first arithmetic circuit performs calculations given by $$A_3 \cos 3(\theta_h + 2n\pi/m)$$

where m is the number of said coils, n (n=1 to m) is a number given to each coil, $A_3$ is a coefficient for determining the strength of a hexapole field for correction of said three-fold astigmatism, and $\theta_h$ is a term for determining the phase angle of said hexapole field, and wherein second arithmetic circuit performs calculations given by $$A_2 \cos 2(\theta_q + 2n\pi/m)$$

where $A_2$ is a coefficient for determining the strength of a quadrupole field for correction of said two-fold astigmatism and $\theta_q$ is a term for determining the phase angle of said quadrupole field.

5. The stigmator assembly of any one of claims 1–4, wherein said stigmator assembly is incorporated in a transmission electron microscope.

* * * * *